(12) United States Patent
Hwang et al.

(10) Patent No.: US 10,969,677 B2
(45) Date of Patent: Apr. 6, 2021

(54) FILM MASK, METHOD FOR MANUFACTURING SAME, AND METHOD FOR FORMING PATTERN USING FILM MASK

(71) Applicant: LG CHEM, LTD., Seoul (KR)

(72) Inventors: Ji Young Hwang, Daejeon (KR); Han Min Seo, Daejeon (KR); Nam Seok Bae, Daejeon (KR); Seung Heon Lee, Daejeon (KR); Dong Hyun Oh, Daejeon (KR); Chan Hyoung Park, Daejeon (KR); Ki-Hwan Kim, Daejeon (KR); Ilha Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 232 days.

(21) Appl. No.: 15/776,042

(22) PCT Filed: Jan. 31, 2017

(86) PCT No.: PCT/KR2017/001029
§ 371 (c)(1),
(2) Date: May 14, 2018

(87) PCT Pub. No.: WO2017/131497
PCT Pub. Date: Aug. 3, 2017

(65) Prior Publication Data
US 2018/0329286 A1  Nov. 15, 2018

(30) Foreign Application Priority Data
Jan. 27, 2016  (KR) .......................... 10-2016-0010222

(51) Int. Cl.
*G03F 1/54* (2012.01)
*G03F 1/38* (2012.01)
(Continued)

(52) U.S. Cl.
CPC .................. *G03F 1/54* (2013.01); *G03F 1/38* (2013.01); *G03F 1/48* (2013.01); *G03F 1/50* (2013.01);
(Continued)

(58) Field of Classification Search
CPC ..... G03F 1/54; G03F 1/38; G03F 1/48; G03F 1/50; G03F 1/56; G03F 7/20;
(Continued)

(56) References Cited

U.S. PATENT DOCUMENTS 4,735,890 A * 4/1988 Nakane ..................... G03F 1/48
430/311
4,752,498 A    6/1988 Fudim
(Continued)

FOREIGN PATENT DOCUMENTS

CN       1595294      3/2005
CN      104937697     9/2015
(Continued)

OTHER PUBLICATIONS

Machine translation of 57-124436 (1982).*
(Continued)

*Primary Examiner* — Martin J Angebranndt
(74) *Attorney, Agent, or Firm* — Dentons US LLP (57) ABSTRACT

The present application relates to a film mask including: a transparent substrate; a darkened light-shielding pattern layer provided on the transparent substrate; and a release force enhancement layer provided on the darkened light-shielding pattern layer and having surface energy of 30 dynes/cm or less, a method for manufacturing the same, and a method for forming a pattern using the film mask.

4 Claims, 8 Drawing Sheets

(51) Int. Cl.
  *G03F 1/48* (2012.01)
  *G03F 1/56* (2012.01)
  *G03F 1/50* (2012.01)
  *G03F 7/20* (2006.01)
  *H01L 21/033* (2006.01)

(52) U.S. Cl.
  CPC .............. *G03F 1/56* (2013.01); *G03F 7/20* (2013.01); *G03F 7/2014* (2013.01); *G03F 7/703* (2013.01); *G03F 7/7035* (2013.01); *G03F 7/70791* (2013.01); *H01L 21/033* (2013.01)

(58) Field of Classification Search
  CPC ...... G03F 7/2014; G03F 7/703; G03F 7/7035; G03F 7/70791
  See application file for complete search history.

(56) References Cited

U.S. PATENT DOCUMENTS

| | | | |
|---|---|---|---|
| 5,079,113 A | 1/1992 | Ohta et al. | |
| 5,318,868 A | 6/1994 | Hasegawa et al. | |
| 5,718,991 A * | 2/1998 | Lin | G03F 1/50 430/5 |
| 5,888,674 A * | 3/1999 | Yang | G03F 1/44 430/5 |
| 6,030,729 A * | 2/2000 | Ito | G03F 1/26 430/5 |
| 7,561,332 B2 | 7/2009 | Little et al. | |
| 7,604,906 B1 | 10/2009 | Volk et al. | |
| 7,955,545 B2 | 6/2011 | Lee et al. | |
| 8,177,991 B2 | 5/2012 | Lussem et al. | |
| 8,894,871 B2 | 11/2014 | Shin et al. | |
| 2001/0031426 A1 | 10/2001 | Mancini et al. | |
| 2001/0035821 A1 | 11/2001 | Ruhrig et al. | |
| 2002/0182515 A1 | 12/2002 | Hung | |
| 2003/0091908 A1* | 5/2003 | Takayanagi | G03F 1/56 430/5 |
| 2003/0175154 A1 | 9/2003 | Hsu et al. | |
| 2003/0175427 A1 | 9/2003 | Loo et al. | |
| 2003/0232179 A1 | 12/2003 | Steenblik et al. | |
| 2004/0023162 A1 | 2/2004 | Hasegawa et al. | |
| 2004/0123895 A1 | 7/2004 | Kardauskas et al. | |
| 2005/0042553 A1 | 2/2005 | Lu et al. | |
| 2005/0170621 A1 | 8/2005 | Kim et al. | |
| 2005/0227497 A1 | 10/2005 | Padovani | |
| 2005/0250276 A1 | 11/2005 | Heath et al. | |
| 2006/0056024 A1 | 3/2006 | Ahn et al. | |
| 2006/0113279 A1 | 6/2006 | Little | |
| 2006/0118514 A1 | 6/2006 | Little et al. | |
| 2006/0267029 A1 | 11/2006 | Li | |
| 2007/0183035 A1 | 8/2007 | Asakawa et al. | |
| 2007/0264481 A1 | 11/2007 | DeSimone et al. | |
| 2008/0041816 A1 | 2/2008 | Choo | |
| 2008/0107973 A1 | 5/2008 | Hattori | |
| 2008/0241491 A1 | 10/2008 | Wessels et al. | |
| 2008/0266502 A1 | 10/2008 | Chiu et al. | |
| 2009/0162799 A1 | 6/2009 | Porque | |
| 2009/0219617 A1 | 9/2009 | Asakawa et al. | |
| 2010/0080914 A1 | 4/2010 | Forrest et al. | |
| 2010/0320742 A1 | 12/2010 | Hoffmuller et al. | |
| 2012/0015288 A1 | 1/2012 | Ikeda et al. | |
| 2012/0021139 A1 | 1/2012 | Chang et al. | |
| 2013/0167355 A1 | 7/2013 | Lutz et al. | |
| 2013/0270223 A1 | 10/2013 | Lee et al. | |
| 2013/0314685 A1 | 11/2013 | Shin | |
| 2015/0010766 A1 | 1/2015 | Hwang et al. | |
| 2015/0064628 A1 | 3/2015 | Guo | |
| 2015/0118603 A1* | 4/2015 | Hong | G03F 1/00 430/5 |
| 2015/0309417 A1 | 10/2015 | Park et al. | |
| 2015/0368453 A1 | 12/2015 | Herzog | |
| 2015/0378252 A1 | 12/2015 | Lee et al. | |
| 2017/0075051 A1* | 3/2017 | Jeong | G02B 5/3058 |
| 2017/0133639 A1 | 5/2017 | Yu | |
| 2017/0157836 A1 | 6/2017 | Miyazawa | |
| 2018/0329286 A1 | 11/2018 | Hwang et al. | |
| 2018/0341176 A1* | 11/2018 | Hwang | G03F 1/54 |
| 2018/0348627 A1* | 12/2018 | Hwang | G03F 7/0002 |

FOREIGN PATENT DOCUMENTS

| | | | |
|---|---|---|---|
| CN | 105118844 | 12/2015 | |
| DE | 10-2007-049315 | 4/2009 | |
| EP | 3410214 | 12/2018 | |
| JP | 50-057425 | * 5/1975 | ............ G03F 1/004 |
| JP | 53-023277 | * 3/1978 | ............ G03F 1/58 |
| JP | S53-68578 | 6/1978 | |
| JP | S53-123467 | 10/1978 | |
| JP | S54-71987 | 6/1979 | |
| JP | S54-141573 | 11/1979 | |
| JP | 55-000904 B | * 1/1980 | |
| JP | S56-64343 | 6/1981 | |
| JP | 57-046243 | * 3/1982 | ............ G03F 1/48 |
| JP | 57-124436 | * 8/1982 | |
| JP | S58-58546 | 4/1983 | |
| JP | S59-84245 | 5/1984 | |
| JP | S59-143157 | 8/1984 | |
| JP | S60-43660 | 3/1985 | |
| JP | S60-240737 | 11/1985 | |
| JP | 61-196245 | * 8/1986 | ............ G03F 1/50 |
| JP | 62-005244 | * 1/1987 | |
| JP | 62-035361 | * 2/1987 | ............ G03F 1/58 |
| JP | S62-35361 | 2/1987 | |
| JP | S62-40458 | 2/1987 | |
| JP | S62-67546 | 3/1987 | |
| JP | S62-85251 | 4/1987 | |
| JP | 01-166046 | * 6/1989 | |
| JP | H01-171528 | 7/1989 | |
| JP | H01-241120 | 9/1989 | |
| JP | H02-93537 | 4/1990 | |
| JP | H03-20733 | 1/1991 | |
| JP | H03-129346 | 6/1991 | |
| JP | 04-093948 | * 3/1992 | ............ G03F 1/14 |
| JP | 04-269749 | * 9/1992 | ............ G03F 1/08 |
| JP | 04-294193 | * 10/1992 | |
| JP | H04-298382 | 10/1992 | |
| JP | H05-34896 | 2/1993 | |
| JP | H05-200757 | 8/1993 | |
| JP | H05-265196 | 10/1993 | |
| JP | H06-120124 | 4/1994 | |
| JP | H06-250378 | 9/1994 | |
| JP | H07-174911 | 7/1995 | |
| JP | H08-21746 | 1/1996 | |
| JP | H08-99359 | 4/1996 | |
| JP | H10-51082 | 2/1998 | |
| JP | H10-51183 | 2/1998 | |
| JP | 2002-062638 | * 2/2002 | |
| JP | 2003-107677 | 4/2003 | |
| JP | 2003-195472 | 7/2003 | |
| JP | 2003-279949 | 10/2003 | |
| JP | 2004-304097 | 10/2004 | |
| JP | 2005-056981 | 3/2005 | |
| JP | 2005-062545 | 3/2005 | |
| JP | 2005-215624 | 8/2005 | |
| JP | 2006-011211 | 1/2006 | |
| JP | 2006-084776 | 3/2006 | |
| JP | 2006-324369 | 11/2006 | |
| JP | 2006-327182 | 12/2006 | |
| JP | 2007-128083 | 5/2007 | |
| JP | 2007-150053 | 6/2007 | |
| JP | 2007-165679 | 6/2007 | |
| JP | 2008-046580 | 2/2008 | |
| JP | 2008-074043 | 4/2008 | |
| JP | 2008-090238 | 4/2008 | |
| JP | 2008-522226 | 6/2008 | |
| JP | 2008-241987 | 10/2008 | |
| JP | 2008-242293 | 10/2008 | |
| JP | 2008-299178 | 12/2008 | |
| JP | 2008-311416 | 12/2008 | |
| JP | 2009-092840 | * 4/2009 | |
| JP | 2009-093084 | 4/2009 | |
| JP | 2009-105252 | 5/2009 | |

(56) References Cited

FOREIGN PATENT DOCUMENTS

| | | |
|---|---|---|
| JP | 2009-145742 | 7/2009 |
| JP | 2009-188237 | 8/2009 |
| JP | 2010060681 | 3/2010 |
| JP | 2010-158805 | 7/2010 |
| JP | 2010-237542 | 10/2010 |
| JP | 2011-028174 | 2/2011 |
| JP | 2011-029248 | 2/2011 |
| JP | 2011-062879 | 3/2011 |
| JP | 2011-133750 | 7/2011 |
| JP | 2011-183731 | 9/2011 |
| JP | 2011-242473 | 12/2011 |
| JP | 2012-101474 | 5/2012 |
| JP | 2012-108352 | 6/2012 |
| JP | 2014-096593 | 5/2014 |
| JP | 2003-295428 | 3/2015 |
| JP | 2015-507214 | 3/2015 |
| JP | 2015-079100 | 4/2015 |
| JP | 2015-159179 | 9/2015 |
| JP | 2018-535446 | 11/2018 |
| JP | 2018-536184 | 12/2018 |
| JP | 2019-502143 | 1/2019 |
| KR | 10-0271699 | 12/2000 |
| KR | 10-2005-0038243 | 4/2005 |
| KR | 10-2007-0027083 | 3/2007 |
| KR | 10-2009-0003601 | 1/2009 |
| KR | 10-2009-0019200 | 2/2009 |
| KR | 10-2010-0074434 | 7/2010 |
| KR | 10-2011-0107120 | 9/2011 |
| KR | 10-2012-0019241 | 3/2012 |
| KR | 10-2013-0061657 | 6/2013 |
| KR | 10-2013-0091225 | 8/2013 |
| KR | 10-2013-0116978 | 10/2013 |
| KR | 10-2013-0126391 | 11/2013 |
| KR | 10-2015-0004647 | 1/2015 |
| WO | 2016-006592 | 1/2016 |
| WO | 2014-104074 | 1/2017 |

OTHER PUBLICATIONS

Machine translation of JP 04-294193 (1992).*
Machine translation of JP 55-000904B (Jan. 1980).*
Kim et al., "Nanolithography based on patterned metal transfer and its application to organic electronic devices," Applied Physics Letters, AIP Publishing LLC, US, vol. 80, No. 21, May 27, 2002, pp. 4051-4053.

* cited by examiner

FILM MASK, METHOD FOR MANUFACTURING SAME, AND METHOD FOR FORMING PATTERN USING FILM MASK

TECHNICAL FIELD

This application is a National Stage Application of International Application No. PCT/KR2017/001029 filed on Jan. 31, 2017, which claims priority to and the benefit of Korean Patent Application No. 10-2016-0010222 filed in the Korean Intellectual Property Office on Jan. 27, 2016, both of which are incorporated herein in their entirety by reference for all purposes as if fully set forth herein.

The present application relates to a film mask, a method for manufacturing the same, and a method for forming a pattern using the film mask.

BACKGROUND ART

A general photolithography technology is based on a flat panel such as a wafer or glass. Accordingly, the process capability is greatly affected by stiffness and flatness of a substrate, and the like. However, a market demand for a flexible substrate which may be used in flexible displays and devices has been gradually increased, and accordingly, the change in process is also continuously required.

However, since an existing flat panel-type photomask has a limitation in being combined with a flexible substrate such as a film substrate in order to apply a roll-to-roll process, a need for a flexible photomask having a high resolution is continuously increasing.

In the case of a general film mask, as a pattern implementation layer which satisfies all of light blocking layer characteristics, anti-reflection layer characteristics, and the like that a mask basically has, Ag halide is usually used. However, a Ag halide material has a limitation in ability to implement a pattern. Further, the Ag halide material has various problems with implementing a high resolution due to irregularities and the like of a surface protective layer applied in order to protect a gelatin layer simultaneously used with Ag halide from chemicals. When an existing Ag halide-based film mask is used, a high resolution is highly likely to exhibit a scan mura during the manufacture of a mask, and a problem with the shape of an implemented pattern occurs. When a mask, in which a scan mura occurs, is used, the scan mura is reflected in the product, and there is a problem in that different pattern shapes occur at each defective position due to the scan mura, so that it is impossible to implement a fixed fine pattern having a line width of 15 μm or less.

Therefore, there is a need for developing a film mask using a new material in order to overcome the problem.

CITATION LIST

Patent Document (Patent Document 1) Korean Patent Application Laid-Open No. 1992-0007912

DETAILED DESCRIPTION OF THE INVENTION

Technical Problem

The present application has been made in an effort to provide a film mask which is flexible enough to be applied to a roll-to-roll process and can form a high-resolution pattern, a method for manufacturing the same, and a method for forming a pattern using the film mask.

Technical Solution

An exemplary embodiment of the present application provides a film mask including:
a transparent substrate;
a darkened light-shielding pattern layer provided on the transparent substrate; and
a release force enhancement layer provided on the darkened light-shielding pattern layer and having surface energy of 30 dynes/cm or less.

According to another exemplary embodiment of the present application, in the exemplary embodiment, the release force enhancement layer has surface energy of preferably 22 dynes/cm or less, and more preferably 15 dynes/cm or less.

According to still another exemplary embodiment of the present application, in the exemplary embodiment, the darkened light-shielding pattern layer preferably exhibits shielding characteristics in a UV region, and is not particularly limited as long as the darkened light-shielding pattern layer has a reflectance of about 30% or less in the UV region range, for example. According to an exemplary embodiment, the darkened light-shielding pattern layer may be composed of at least one of a black matrix material, a carbon black-based material, a resin mixed with a dye, and AlOxNy (0≤x≤1.5, 0≤y≤1, and x and y are a ratio of O atoms and N atoms to one Al atom, respectively).

According to another exemplary embodiment of the present application, in the exemplary embodiment, the film mask may additionally include a metal layer provided between the transparent substrate and the darkened light-shielding pattern layer. The metal layer is, for example, an aluminum layer.

According to still another exemplary embodiment of the present application, in the exemplary embodiment, a metal layer is provided between the transparent substrate and the darkened light-shielding pattern layer, the film mask includes two or more regions of the metal layer where the thicknesses are different from each other or two or more regions of the darkened light-shielding pattern layer where the thicknesses are different from each other, or the film mask includes a region where a metal layer is provided between the transparent substrate and the darkened light-shielding pattern layer and a region where the transparent substrate and the darkened light-shielding pattern layer are brought into direct contact with each other.

According to yet another exemplary embodiment of the present application, in the exemplary embodiment, the film mask additionally includes a surface protective layer between the darkened light-shielding pattern layer and the release force enhancement layer.

According to still yet another exemplary embodiment of the present application, in the exemplary embodiment, the film mask further includes an attachment layer provided between the darkened light-shielding pattern layer and the transparent substrate.

According to a further exemplary embodiment of the present application, in the exemplary embodiment, the film mask includes a metal layer provided between the darkened light-shielding pattern layer and the transparent substrate, and further includes an attachment layer between the metal layer and the transparent substrate.

According to another further exemplary embodiment of the present application, in the exemplary embodiment, the film mask may further include an additional substrate attached, by using a bonding layer, to a surface opposite to a surface of the substrate facing the darkened light-shielding pattern layer.

Still another exemplary embodiment of the present specification provides a method for manufacturing a film mask, the method including:

forming a darkened light-shielding pattern layer on a transparent substrate; and forming a release force enhancement layer on the darkened light-shielding pattern layer.

Yet another exemplary embodiment of the present application provides a method for forming a pattern by using the film mask according to the above-described exemplary embodiments.

Advantageous Effects

The film mask according to the exemplary embodiments described in the present application is flexible enough to be applied to roll-to-roll, and may prevent scratches during a roll-to-roll travel by a release force enhancement layer and may prevent a problem in that a mask stains with a resin during a process. Accordingly, it is possible to form a high-resolution pattern even by a flexible film mask. Further, a high-resolution pattern or a half tone pattern may be introduced by introducing AlOxNy as a material for a darkened light-shielding pattern layer of a film mask.

BEST MODE

A film mask according to an exemplary embodiment of the present application is characterized by including: a transparent substrate; a darkened light-shielding pattern layer provided on the transparent substrate; and a release force enhancement layer provided on the darkened light-shielding pattern layer. At this time, the release force enhancement layer has surface energy of 30 dynes/cm or less.

Figure 1:
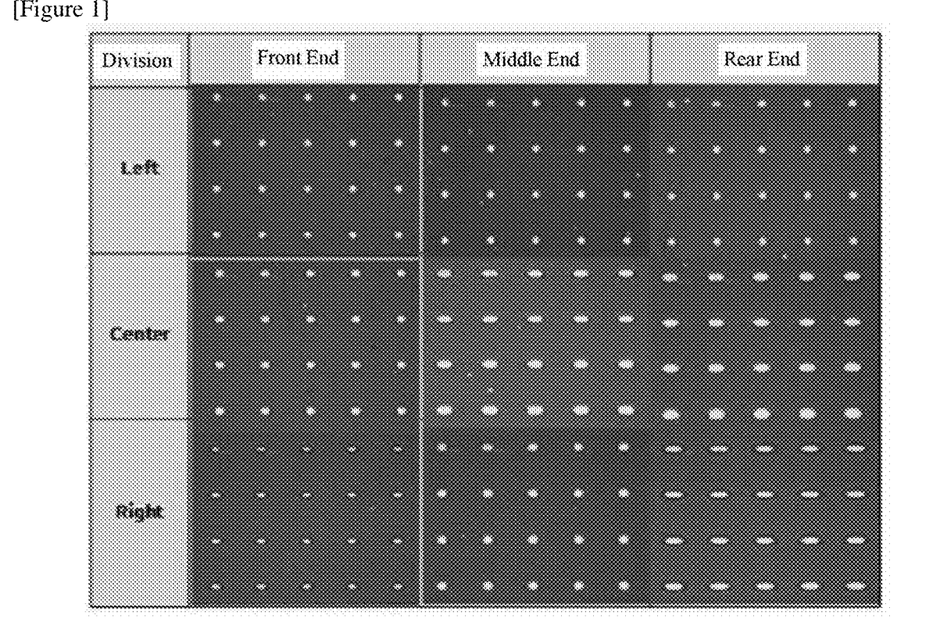
FIG. 1 is a photograph of an example in which when a pattern is formed by using a mask resin in the related art, in the case where a photosensitive resin and a mask are not completely adhered to each other, a shape and a size of the pattern are distorted according to a local position.

In general, a photolithography process is performed through an equipment configuration similar to an existing soft mold imprinting process by using a positive-type or negative-type photosensitive resin. At this time, a photosensitive resin and a mask used for patterning a substrate are generally completely adhered to each other for a pattern resolution, and otherwise, the shape and the size of the pattern are distorted according to a local position as illustrated in FIG. 1.

In this case, when the mask is not subjected to a separate treatment, scratches occur on the mask during a roll-to-roll travel, or there occurs a case where the mask stains with the photosensitive resin during the process, so that there occurs a case where the pattern is hindered from being implemented in a subsequent process. Accordingly, the film mask needs to be subjected to a release treatment in order to maximize release force between the resin and the mask during a roll-to-roll process, and a cleaning process for removing a residue is additionally performed. In contrast, in the case of a photosensitive resin, a liquid or semi-dry photosensitive resin is usually used in order to maximize adhesion force between the mask and the photosensitive resin. In order to maximize adhesion force between the mask and the photosensitive resin and release force therebetween when a residue is removed, in the present application, as a result of introducing and evaluating various release treatment methods for maximizing release force between the mask and the photosensitive resin, a release force enhancement layer was introduced onto a darkened light-shielding pattern layer.

As a result of measuring the surface energy of the release force enhancement layer, it was confirmed that the release force enhancement layer is effective for general releasing processes and molding processes when the release force enhancement layer has surface energy, for example, 30 dynes/cm or less which is equal to or less than that of a substrate to be patterned, for example, a plastic film such PET, an ITO film, and the like. As the release force enhancement layer, a release force enhancement layer having surface energy of preferably 22 dynes/cm or less, and more preferably 15 dynes/cm or less exhibited a good performance. The lower the surface energy of the release force enhancement layer is, the better the release force enhancement layer is, and the surface energy may be more than 0 dynes/cm and 30 dynes/cm or less.

A material for the release force enhancement layer is not particularly limited as long as the material has the surface energy, and a fluorine-based material, a silicone-based material, or a mixture thereof may be used. As a specific example, it is possible to use a fluorine-based material having a perfluoroether chain, a silicone-based material having an alkoxy silane or silanol, or a mixture thereof. The silicone-based material such as the alkoxy silane or silanol may improve attaching properties to other substrates. Additionally, the release force enhancement layer may additionally include a $SiO_2$ layer or a $TiO_2$ layer in order to reinforce the durability of the release force enhancement layer. For example, when a $SiO_2$ layer or a $TiO_2$ layer is first deposited, and then a layer including a silanol is formed, —OH of the silanol is subjected to a dehydration condensation reaction at room temperature, and thus may induce the layer including the silanol to be completely bonded to a surface of a layer which is brought into contact with the layer including the silanol.

Figure 2:
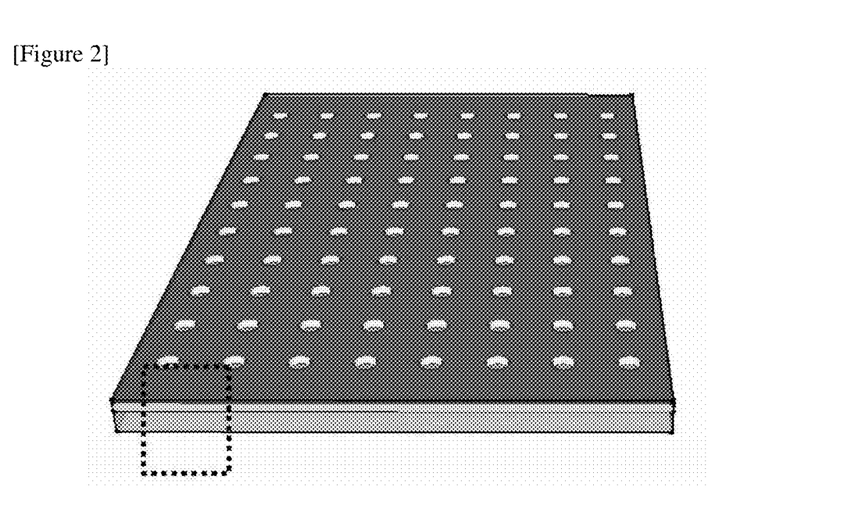
FIG. 2 exemplifies a perspective view of a structure of a film mask according to an exemplary embodiment of the present application.
Figure 3:
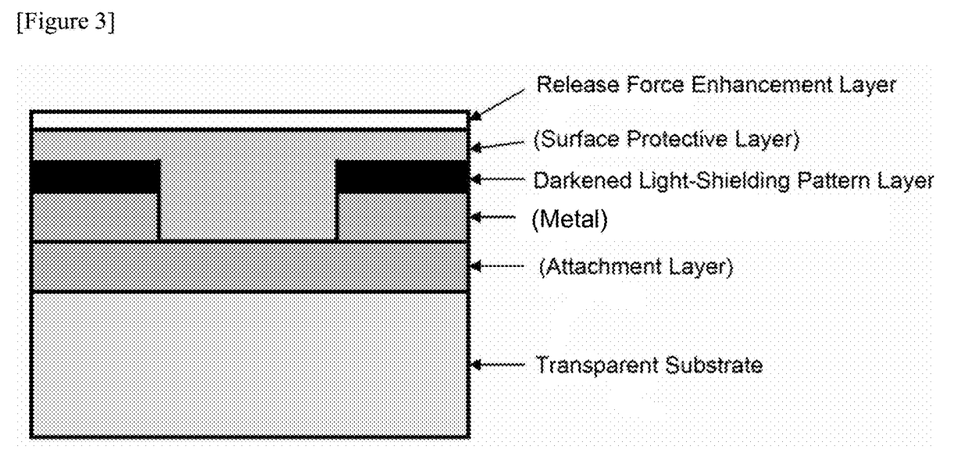
FIG. 3 exemplifies a cross-sectional view of a structure of a film mask according to an exemplary embodiment of the present application.

FIGS. 2 and 3 illustrate the structure of the film mask of the present application according to the exemplary embodiment. FIG. 2 is a perspective view of the film mask, and FIG. 3 illustrates a vertical cross-sectional view of a portion marked with a dotted line in FIG. 2. FIG. 3 further includes an attachment layer, a metal layer, and a surface protective layer in addition to the transparent substrate, the darkened light-shielding pattern layer, and the release force enhancement layer, but these structures may be omitted, if necessary.

At this time, according to the durability and attaching characteristics of a material serving to shield light in a mask, an attachment layer may be additionally provided at the lower portion of a darkened light-shielding layer, or a surface protective layer may be additionally introduced between a release force enhancement layer and a darkened light-shielding pattern layer. Furthermore, according to the process by a user, a film mask manufactured for the purpose of increasing a thickness may be reinforced and used through an additional substrate and an additional bonding layer.

The transparent substrate is not particularly limited as long as the transparent substrate has a light transmittance enough for an exposure process to be carried out by using the above-described film mask.

In the exemplary embodiment, the darkened light-shielding pattern layer is not particularly limited as long as the pattern layer exhibits shielding characteristics of a UV region, and for the darkened light-shielding pattern layer, it is possible to use, for example, a material having a reflectance of about 30% or less in the UV region range (100 nm to 400 nm). According to an exemplary embodiment, the darkened light-shielding pattern layer may be composed of at least one of a black matrix material, a carbon black-based material, a resin mixed with a dye, and AlOxNy (0≤x≤1.5, 0≤y≤1, and x and y are a ratio of O atoms and N atoms to one Al atom, respectively). The range of x and y is preferably x>0, or y>0, or x>0 and y>0.

When the darkened light-shielding pattern layer is composed of AlOxNy, it is preferred that 0<x≤1.5 or 0<y≤1. When aluminum oxide, aluminum nitride, or aluminum oxynitride is used as the darkened light-shielding pattern layer, the darkened light-shielding pattern layer may alone exhibit semi-permeable characteristics and anti-reflection characteristics for the UV wavelength, so that according to the thickness of the darkened light-shielding pattern layer based on the characteristics, or by introducing a stacking structure with a metal layer based on these characteristics, the darkened light-shielding pattern layer may be applied to the manufacture of a half tone mask used for the purpose of multilayer patterning.

The material and thickness of the darkened light-shielding pattern layer may be determined according to a size or a form of a material and a pattern to be patterned by using a film mask, and particularly, the thickness thereof may be determined according to the required UV light transmittance. For example, the darkened light-shielding pattern layer may have a thickness of 5 nm to 200 nm, and the thickness of the darkened light-shielding pattern layer is not limited as long as the thickness of the darkened light-shielding pattern layer is enough to shield light.

The darkened light-shielding pattern layer may have a pattern form having a form of a pattern to be implemented by UV exposure as an opening region. For example, when a pattern with a cylindrical form or a dot form is intended to be formed, the darkened light-shielding pattern layer may have a pattern having circular openings. When the darkened light-shielding pattern layer is formed of the above-described AlOxNy, the size of the opening is easily formed with a desired size, and the darkened light-shielding pattern layer may have, for example, a circular opening having a diameter of 1 to 30 μm, or a linear opening having a line width of 1 to 30 μm. In particular, when the darkened light-shielding pattern layer is formed of the above-described AlOxNy, a high-resolution pattern with 15 μm or less may be formed, and a scan mura problem caused by the exposure method may be minimized.

In order to implement the pattern of the darkened light-shielding pattern layer, it is possible to apply various methods utilizing photolithography in addition to a direct exposure process using laser, which is typically used, or using a printing technique such as offset and inkjet.

The transparent substrate may be determined according to the size or material of a pattern to be patterned by using a film mask, and for example, it is preferred that a transparent substrate having a visible light transmittance of 50% or more is used. In order to use a roll when a pattern is formed by using a film mask, it is preferred that as the transparent substrate, a flexible substrate is used, and for example, a plastic film, specifically, a polyethylene terephthalate (PET) film may be used. The thickness of the transparent substrate is sufficient as long as the thickness may support a film mask, and is not particularly limited. For example, the transparent substrate may have a thickness of 10 nm to 1 mm, specifically, 10 μm to 500 μm.

As the attachment layer, it is possible to use an attachment layer which does not negatively affect a patterning using a film mask while reinforcing the attaching force between a transparent substrate and a darkened light-shielding pattern layer or a metal layer. For example, an attachment layer material such as an acrylic, epoxy-based or urethane-based material may be used.

Thereafter, in the case of the surface protective layer, a urethane acrylate-based surface protective layer may be introduced as an example, but in the case of hardness at the HB level or higher, it was also confirmed that the material for the surface protective layer was not particularly limited. However, when a residual film and an increase in resolution of a product through a film mask, and the like are considered, it is preferred that a layer which has a larger refractive index than that of a substrate or an attachment layer and does not absorb UV light is used as a surface protective layer, if possible. Thereafter, in the case of a release force enhancement layer corresponding to an outermost layer, it was confirmed that a layer in a form including a fluorine-based material, a silicone-based material, or a mixture thereof could be introduced, and when the layer was introduced, a layer having a thickness of 100 nm or less was preferred. Examples of a method for forming the corresponding layer include a wet coating method and a vapor deposition method, and the vapor deposition method is more advantageous.

According to another exemplary embodiment of the present application, in the exemplary embodiment, the film mask may additionally include a metal layer between the transparent substrate and the darkened light-shielding pattern layer. The metal layer may compensate light-shielding properties of the darkened light-shielding pattern layer, and may facilitate the formation or patterning of the darkened light-shielding pattern layer. For the metal layer, a material capable of compensating light-shielding properties, or a material which easily forms the darkened light-shielding pattern layer may be used. For example, aluminum (Al) may be used, and in this case, a darkened light-shielding pattern layer composed of aluminum oxide, aluminum nitride, or aluminum oxynitride is easily formed thereon. Further, it is easy for aluminum to be patterned simultaneously with a darkened light-shielding pattern layer composed of aluminum oxide, aluminum nitride, or aluminum oxynitride. The thickness of the metal layer may be determined in consideration of light-shielding properties, processability, or flexibility, and may be determined within, for example, 1 nm to 10 μm.

A mask in the related art is composed of a light shielding layer capable of shield light and provided on a transparent substrate, and an anti-reflection layer provided on the light shielding layer. The anti-reflection layer is for minimizing a change in critical dimension (CD) of a mask pattern, which occurs when UV light irradiated onto a light shielding layer is reflected from the light shielding layer during the manufacture of the mask pattern. In the configuration, effects of reducing the number of processes and preventing reflection in a light shielding region may be maximized only when the light shielding layer and the anti-reflection layer in the lower layer have a composition to enable patterning in the same manners as in an existing photomask.

Figure 4:
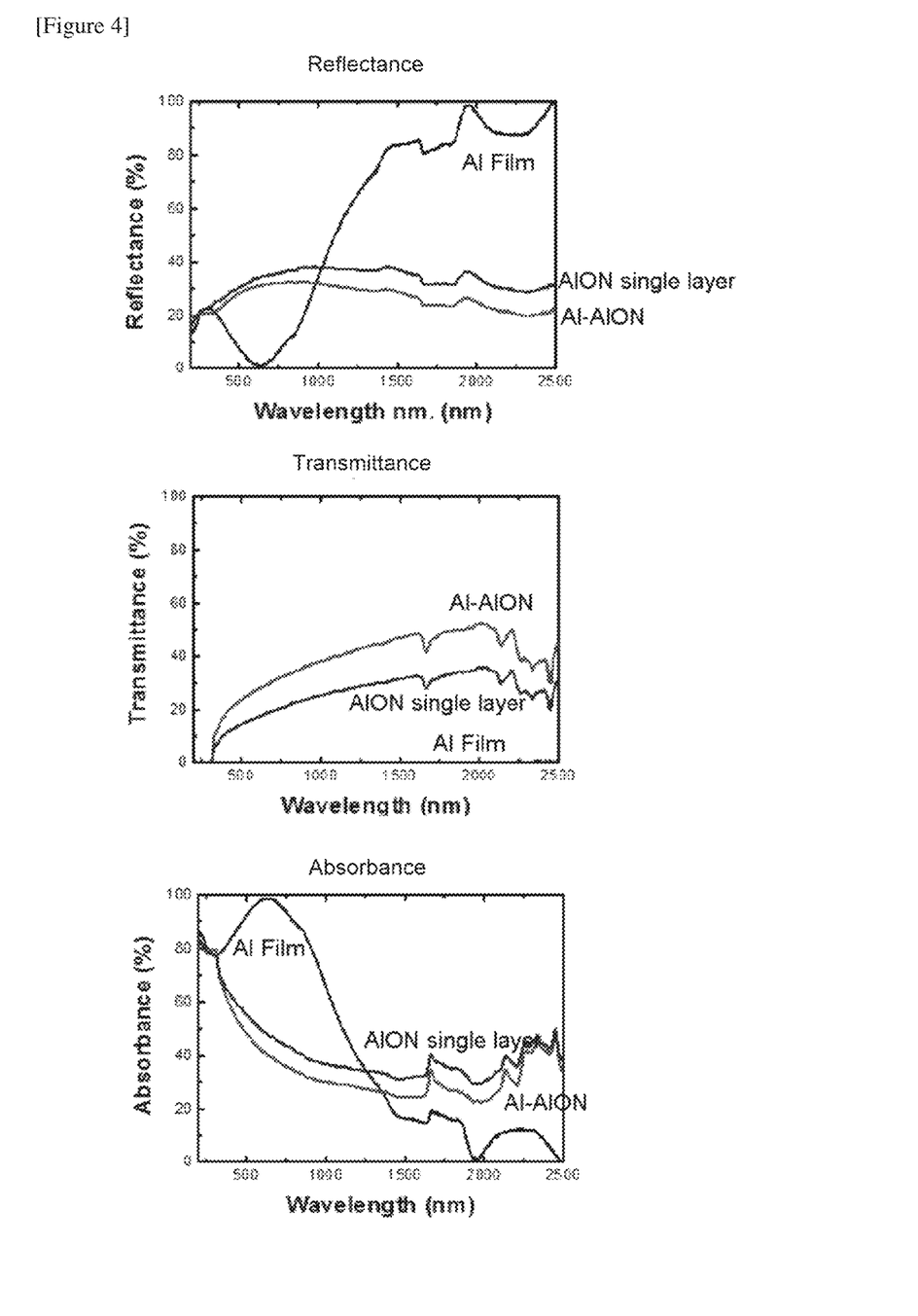
FIG. 4 illustrates reflectance, transmittance, and absorbance of a material for a darkened light-shielding pattern layer according to an exemplary embodiment of the present application according to the wavelength.

As a result of measuring reflection and absorption wavelengths for the UV region (100 nm to 400 nm) with respect to a single layer and a stacking (AlOxNy/Al) structure of each of an Al layer and an Al-based oxynitride, the present inventors confirmed that the stacking structure had a reflectance of about 30% or less for the UV region range, and that the stacking structure could be used on the whole as a material for a mask by absorbing the other light, as illustrated in FIG. 4. In other words, the AlOxNy layer alone exhibits semi-permeable characteristics and anti-reflection characteristics for the UV wavelength, so that the present inventors confirmed that the AlOxNy layer could serve as an anti-reflection film in a mask structure in the related art.

Figure 5:
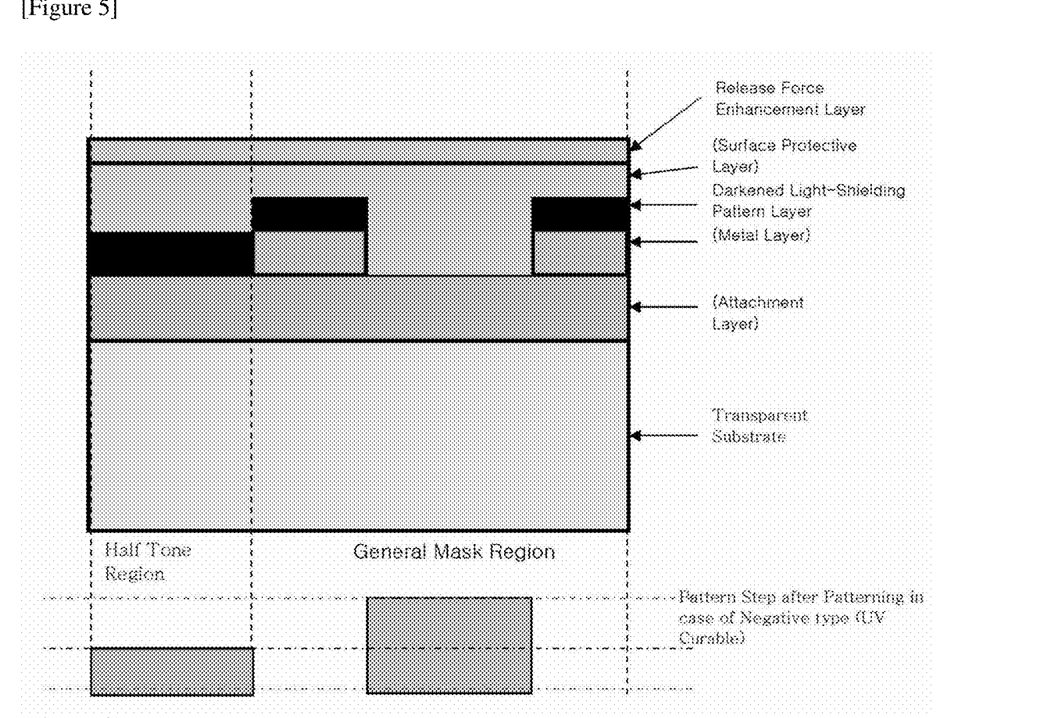
FIGS. 5 and 6 exemplify a structure of a film mask including a half tone region manufactured according to an exemplary embodiment of the present application.

According to still another exemplary embodiment of the present application, in the exemplary embodiment, a metal layer is provided between the transparent substrate and the darkened light-shielding pattern layer, the film mask includes two or more regions of the metal layer where the thicknesses are different from each other or two or more regions of the darkened light-shielding pattern layer where the thicknesses are different from each other, or the film mask includes a region where a metal layer is provided between the transparent substrate and the darkened light-shielding pattern layer and a region where the transparent substrate and the darkened light-shielding pattern layer are brought into direct contact with each other. FIG. 5 exemplifies a structure of a film mask including a region which is provided with a metal layer and a region which is not provided with a metal layer.

Figure 6:
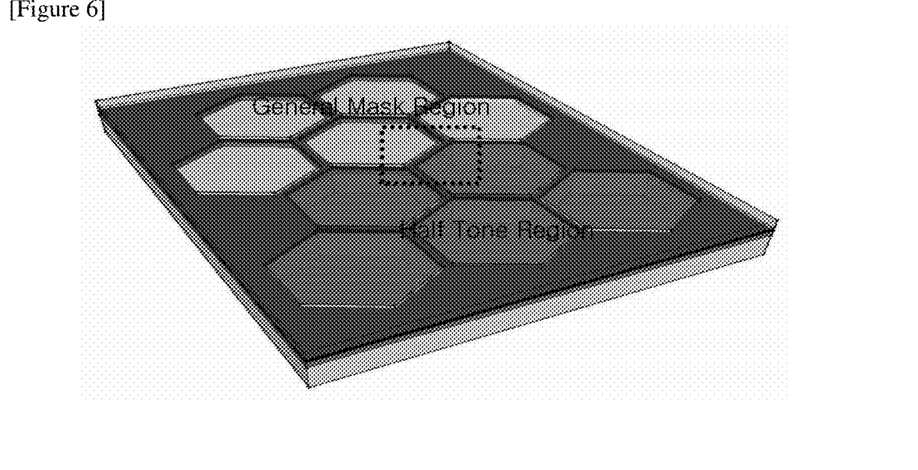

Depending on the thickness of a metal layer or a darkened light-shielding pattern layer or the presence or absence of a metal layer as described above, a portion having a different light transmittance is created in a film mask, thereby manufacturing a half tone region. FIG. 5 exemplifies a step of a pattern when the pattern is formed of a negative-type photosensitive resin. A thickness of a pattern formed by a half tone region, in which a darkened light-shielding pattern layer which transmits only a portion of the UV light is present, is formed to be thinner than the thickness of a pattern formed by a general mask region which does not have a darkened light-shielding pattern and a metal layer. The structure illustrated in FIG. 5 may be a cross-sectional structure of a boundary portion (indicated as a dotted line) of a general mask region and a half tone region of a film mask as illustrated in FIG. 6.

Yet another exemplary embodiment of the present specification provides a method for manufacturing a film mask, the method including:
forming a darkened light-shielding pattern layer on a transparent substrate; and
forming a release force enhancement layer on the darkened light-shielding pattern layer.

The forming of the darkened light-shielding pattern layer may include photoresist (PR) coating, UV exposure, developing, etching, and stripping processes, and may further include an inspection and repair process, if necessary.

Still yet another exemplary embodiment of the present application provides a method for forming a pattern by using the film mask according to the above-described exemplary embodiments. The method may include: applying a photosensitive resin composition onto a substrate; exposing the applied photosensitive resin composition through a film mask; and developing the photosensitive resin composition. The process may be performed through a roll-to-roll process.

Mode for Invention

Hereinafter, the present invention will be described in more detail through Examples. However, the following Examples are only for exemplifying the present invention, and are not intended to limit the present invention.

Reference Examples 1 to 14

An attachment layer was formed on a PET substrate having a thickness of 250 μm by using a urethane-based material, a plasma pre-treatment was carried out, and then an Al layer having a thickness of 100 nm was formed by a sputtering method. An AlOxNy layer (x>0 and 0.3≤y≤1) was formed by means of reactive sputtering by adding nitrogen, which is a reactive gas, onto the Al layer. At this time, Reference Examples 1 to 14 were carried out according to the deposition conditions by the reactive sputtering, and optical characteristics of structural bodies obtained thereby are shown in the following Table 1.

TABLE 1

| No. of Reference Example | Deposition Condition | | Optical Characteristics (D65) | | | |
|---|---|---|---|---|---|---|
| | Speed | N2 (sccm) | L* | a* | b* | Y |
| 1 | 0.5 mpm | 80 | 85.27 | 1.47 | −5.74 | 66.53 |
| 2 | | 70 | 51.34 | 7.46 | −19.07 | 19.56 |
| 3 | | 60 | 68.31 | −0.89 | 0.67 | 38.4 |
| 4 | 0.7 mpm | 60 | 57.25 | −0.3 | −0.88 | 25.18 |
| 5 | | 62 | 53.28 | −0.3 | −2.98 | 21.3 |
| 6 | | 64 | 44.74 | −0.22 | −8.24 | 14.36 |
| 7 | | 66 | 33.05 | 1.42 | −16.62 | 7.56 |
| 8 | | 68 | 23.96 | 7.17 | −25.11 | 4.09 |
| 9 | | 70 | 14.13 | 24.76 | −35.67 | 1.75 |
| 10 | | 72 | 22 | 33.76 | −19.1 | 3.52 |
| 11 | | 74 | 46.37 | 22.15 | 10.37 | 15.55 |
| 12 | | 76 | 74.94 | 7.14 | 16.52 | 48.19 |
| 13 | | 78 | 89.11 | −0.06 | 5.44 | 74.41 |
| 14 | | 80 | 89.61 | −0.24 | 5.18 | 75.64 |

As shown in Table 1, it can be confirmed that optical characteristics of the layer manufactured according to the deposition conditions of aluminum oxynitride are different from each other. Therefore, it can be confirmed that the darkened light-shielding pattern layer of the film mask manufactured according to the exemplary embodiments described in the present specification may be formed by varying the deposition conditions according to the light-shielding characteristics required.

Examples 1 to 16

An attachment layer, an Al layer (thickness 100 nm), and an AlOxNy layer (x>0, 0.3≤y≤1) (thickness 60 nm) were formed on a PET substrate (thickness 250 μm) in the same manner as in Reference Example 9. Subsequently, a positive-type photoresist (manufactured by DongJin Semichem Co., Ltd., N200) was coated and fixed on a stage, and UV exposure was performed by using a UV laser with a wavelength of 365 nm after a glass mask was placed thereon. Subsequently, a photoresist pattern was formed by performing a development using a 1.38% TMAH solution. By means of the photoresist pattern, the Al layer and the AlOxNy layer were etched by using an acid solution, and stripped by using a peeling solution (LG Chem., LG202) to form a pattern. Subsequently, an inspection and repair process was carried out.

The intensity of UV exposure was 50 mJ in Examples 1 to 8, and 1,100 mJ in Examples 9 to 16.

A darkened light-shielding pattern layer having a circular opening was formed in Examples 1 to 4 and Examples 9 to 12, the diameter of the circular opening and the gap between the openings were 6 μm in Examples 1 and 9, the diameter of the circular opening and the gap between the openings were 8 μm in Examples 2 and 10, the diameter of the circular opening and the gap between the openings were 10 μm in Examples 3 and 11, and the diameter of the circular opening and the gap between the openings were 15 μm in Examples 4 and 12.

A darkened light-shielding pattern layer having an opening in the form of a linear stripe was formed in Examples 5 to 8 and Examples 13 to 16, the line width and the gap between the lines were 6 μm in Examples 5 and 13, the line width and the gap between the lines were 8 μm in Examples 6 and 14, the line width and the gap between the lines were 10 μm in Examples 7 and 15, and the line width and the gap between the lines were 15 μm in Examples 8 and 16. In Examples 5 to 9, the step before the etching was 1.2 μm. In Examples 13 to 16, the pattern step after the stripping was 0.2 μm.

Figure 7:
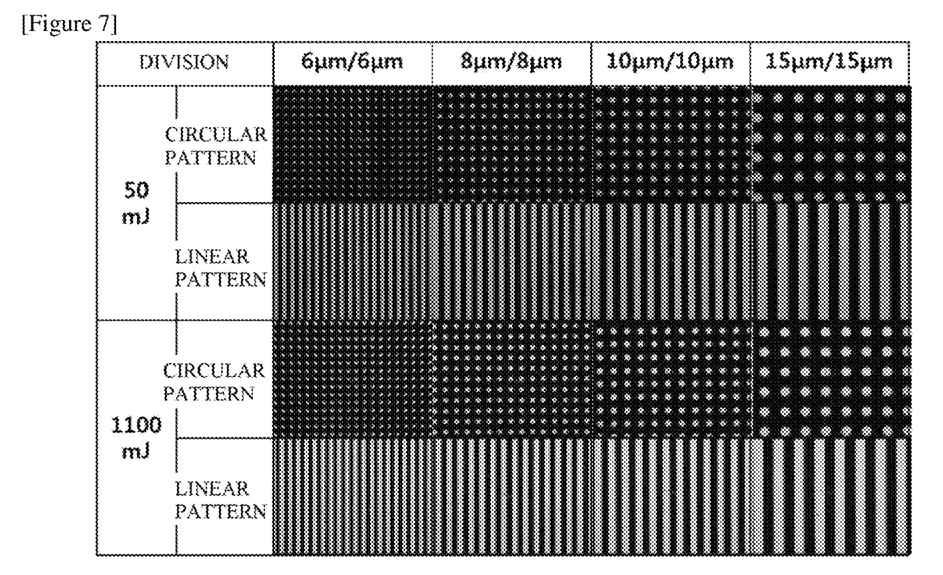
FIG. 7 is a photograph of film masks manufactured in Examples for each resolution.

FIG. 7 illustrates a photograph of the forms of the darkened light-shielding pattern layers of the film masks manufactured in Examples 1 to 16. As a result of confirming patterns having each resolution manufactured in Examples 1 to 16, it was confirmed that the CD precisions in the total region resolutions were excellent. Further, when Examples 1 to 8 (50 mJ) and Examples 9 to 16 (1,100 mJ), of the UV exposure intensities are different from each other, are compared with each other, it can be seen that the difference according to the exposure intensity are not significant.

Next, a urethane acrylate-based surface protective layer was coated and formed thereon, and a release force enhancement layer was formed by using a fluorine-based material having a perfluoropolyether chain.

Figure 8:
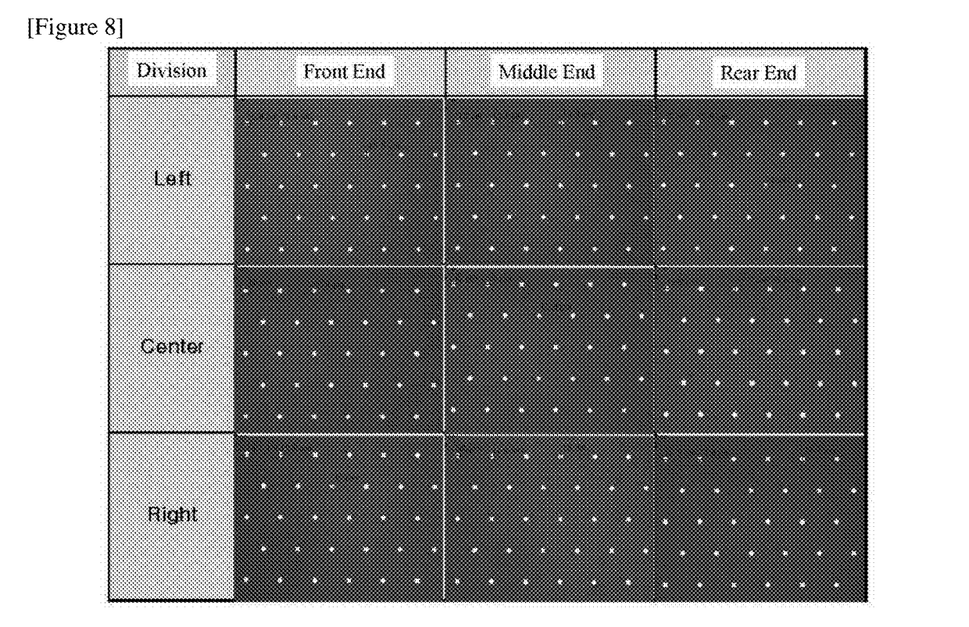
FIG. 8 is a photograph illustrating a pattern implementation state of the film mask manufactured in the Example for each position.
Figure 9:
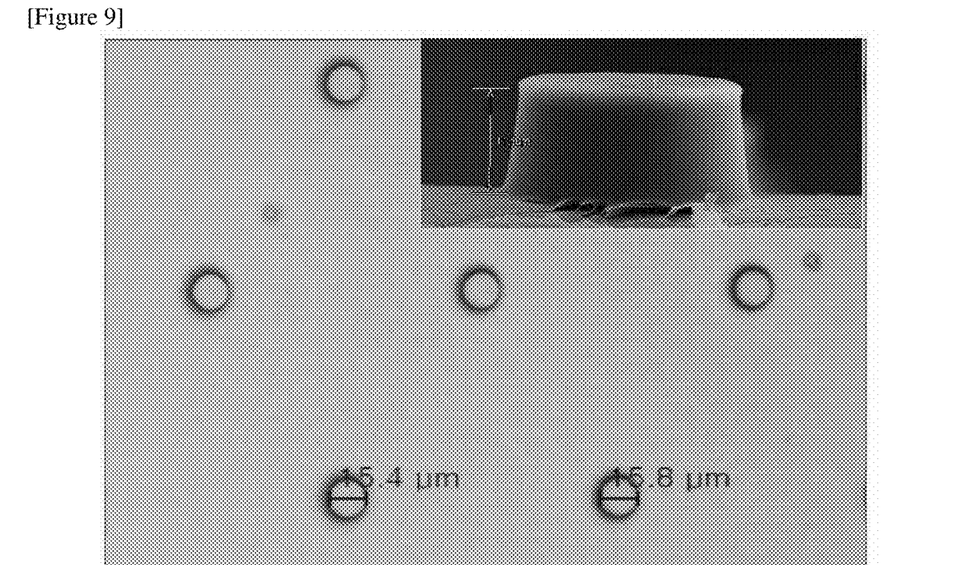
FIG. 9 is a photograph illustrating a form of a pattern manufactured in Example 12.

FIGS. 8 and 9 illustrate a result of forming a pattern by using the film mask manufactured in Example 12. A pattern was formed by disposing a photosensitive resin composition to be patterned on a film, fixing a film mask thereon, and then performing UV exposure through the film mask. At this time, during the UV exposure, an LED UV light source with a wavelength of 365 nm was used, and as the photosensitive resin composition, N200 manufactured by DongJin Semichem Co., Ltd. was used.

Figure 10:
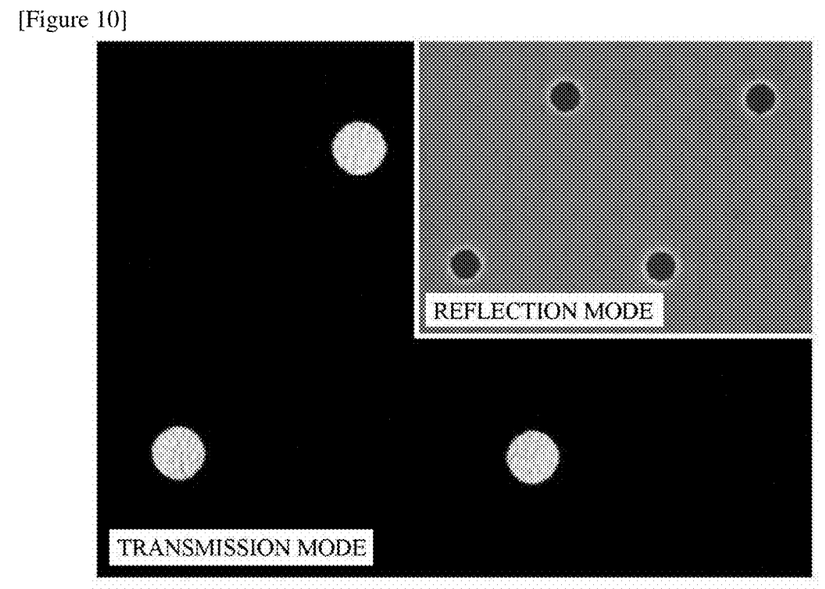
FIG. 10 is a photograph of the film mask manufactured in Example 12, which is measured in a transmission mode and a reflection mode.

Through FIG. 8, when the pattern was formed one time to three times by the same method, it could be confirmed that there was no difference in size of the pattern according to the position (left, center, and right). Through FIG. 9, it could be confirmed that a pattern in the form of a cylinder with diameters of 15.4 μm and 15.8 μm and a height of 11.4 μm was formed. FIG. 10 illustrates a photograph of the film mask manufactured in Example 12, which is measured in a transmission mode and a reflection mode. After the patterning was performed 10 times, 50 times, and 100 times by using the film mask manufactured in Example 12, the surface energy measured was 11.32 dynes/cm, 15.28 dynes/cm, and 21.19 dynes/cm, respectively.

Example 17

A film mask was manufactured in the same manner as in Examples 1 to 16, except that a PET substrate having a thickness of 188 μm was used instead of the PET substrate having a thickness of 250 μm, and a PET substrate having a thickness of 125 μm was attached to one surface of the PET substrate by using an OCA layer (optical clear adhesive layer) having a thickness of 50 μm. By attaching the additional PET substrate as described above, it was confirmed that during the travel of the roll to roll mask, the occurrence of curls was minimized, and as a result, the substrate and the film mask were smoothly brought into contact with each other.

Example 18

An experiment was performed in the same manner as in Example 12, except that a silicone-based release force enhancement layer was formed instead of the fluorine-based release force enhancement layer. The silicone-based release enhancement layer was formed by depositing $SiO_2$ in advance, and then using a roll to roll vapor phase deposition method from a mixed material of a fluorine-based material (fluorine-based material having a perfluoropolyether chain) and a silicone-based material (alkoxysilane). After the patterning was performed 10 times, 50 times, and 100 times by using the manufactured film mask, the surface energy measured was 8.64 dynes/cm, 7.59 dynes/cm, and 7.48 dynes/cm, respectively.

Comparative Example 1

Figure 11:
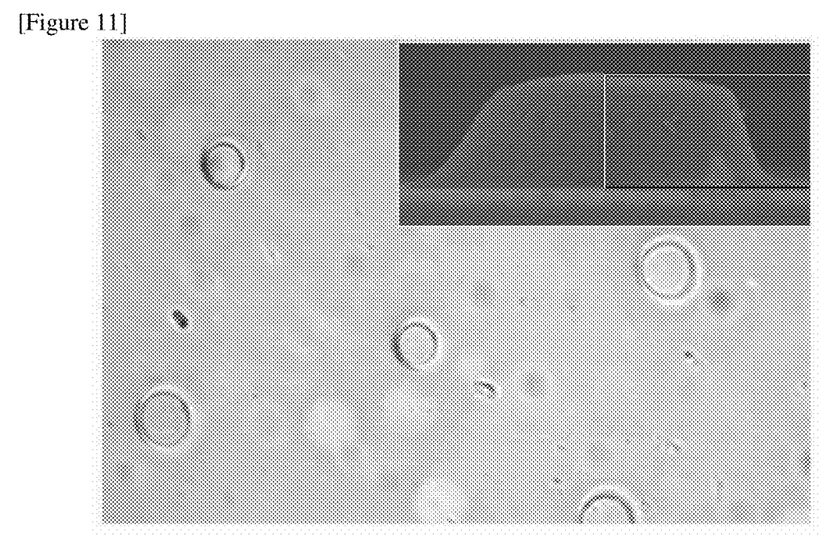
FIG. 11 is a photograph illustrating a form of a pattern manufactured in Comparative Example 1.
Figure 12:
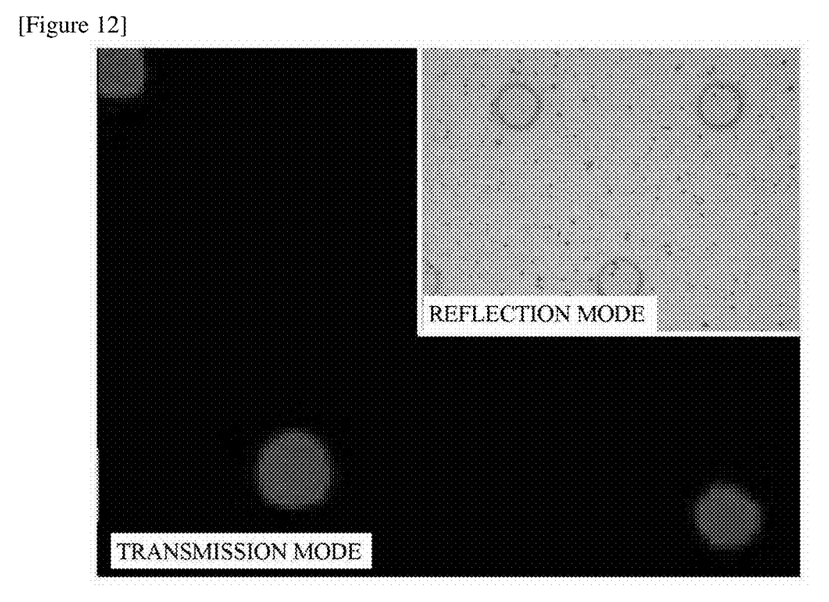
FIG. 12 is a photograph of the film mask manufactured in Comparative Example 1, which is measured in a transmission mode and a reflection mode.

An experiment was performed in the same manner as in Example 12, except that a commercially available film mask having no release force enhancement layer was used. FIG. 1 illustrates a state in which the pattern is implemented for each position after the pattern is formed, and FIG. 11 illustrates a form of the formed pattern. FIG. 12 illustrates a photograph of the darkened light-shielding pattern layer of the film mask manufactured in Comparative Example 1, which is measured in a transmission mode and a reflection mode. Since the positions of the light-shielding layer of the mask in the thickness direction and the types of substrates are different, FIGS. 10 and 12 exhibit different forms.

Example 19

An attachment layer and an Al layer were formed on a PET substrate. Subsequently, a positive-type photoresist (manufactured by DongJin Semichem Co., Ltd., N200) was coated and fixed on a stage, and UV exposure was performed by using a UV laser with a wavelength of 365 nm after a glass mask was placed thereon. Subsequently, the positive-type photoresist was developed by using a 1.38% TMAH solution to form a photoresist pattern. By means of the photoresist pattern, the Al layer was etched by using an acid solution, and stripped by using a peeling solution (LG Chem., LG202) to form a pattern. Subsequently, an inspection and repair process was carried out. Subsequently, an AlOxNy layer (x>0, 0.3≤y≤1) was formed by deposition, a photoresist composition was coated, and then exposure, development, etching, and peeling processes were repeatedly carried out by aligning the upper portion of the Al layer and a half tone region at a position to be disposed using a laser direct imaging equipment, thereby forming a half tone region where the upper portion of the Al layer and the AlOxNy layer without the Al layer were brought into direct contact with a PET substrate provided with an attachment layer.

The invention claimed is:

1. A film mask comprising:
    a transparent, flexible, plastic substrate;
    an attachment layer comprising an acrylic, epoxy-based or urethane-based material on the substrate;
    a patterned metal layer provided on at least one portion of a surface of the attachment layer;
    a darkened light-shielding pattern layer provided:
        (a) on the metal layer; or
        (b) on a portion of a surface of the attachment layer; or
        (c) both (a) and (b),
    and at least one portion of the surface of the attachment layer contains no metal layer and no darkened light-shielding pattern layer;
    a surface protective layer provided on the darkened light-shielding pattern layer and on the portion of the surface of the transparent layer where no darkened light-shielding pattern layer is present; and
    a release force enhancement layer provided on the surface protective layer and having surface energy of 30 dynes/cm or less,
    wherein the darkened light-shielding pattern layer is composed of AlOxNy (0<x≤1.5, 0<y≤1, and x and y are a ratio of O atoms and N atoms to one Al atom, respectively), and
    wherein the metal layer is composed of Al.

2. The film mask of claim 1, wherein the darkened light-shielding pattern layer has a reflectance of about 30% or less in a UV region range.

3. A method for manufacturing the film mask according to claim 1, the method comprising:
    forming the darkened light-shielding pattern layer on a transparent substrate; and
    forming the release force enhancement layer on the darkened light-shielding pattern layer.

4. A method for forming a pattern, comprising:
    applying a photosensitive resin composition onto a substrate;
    exposing the applied photosensitive resin composition to light through the film mask according to claim 1; and
    developing the photosensitive resin composition.

* * * * *